(12) United States Patent
Chen et al.

(10) Patent No.: US 7,342,830 B1
(45) Date of Patent: Mar. 11, 2008

(54) PROGRAM AND PROGRAM VERIFY OPERATIONS FOR FLASH MEMORY

(75) Inventors: Hounien Chen, Fremont, CA (US);
Nancy S. Leong, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 107 days.

(21) Appl. No.: 11/332,263

(22) Filed: Jan. 17, 2006

(51) Int. Cl.
*G11C 11/34* (2006.01)
(52) U.S. Cl. .................................. 365/185.22
(58) Field of Classification Search ........... 365/185.08, 365/185.2, 185.22
See application file for complete search history.

(56) References Cited

U.S. PATENT DOCUMENTS

| | | | |
|---|---|---|---|
| 5,892,710 A | 4/1999 | Fazio et al. | |
| 6,496,410 B1 | 12/2002 | Parker | |
| 6,724,662 B2 | 4/2004 | Manea | |
| 6,894,929 B2 * | 5/2005 | Matsuoka et al. | 365/185.14 |
| 7,020,018 B2 | 3/2006 | Hsieh et al. | |
| 7,149,110 B2 | 12/2006 | Tran et al. | |
| 7,151,701 B2 | 12/2006 | Combe et al. | |
| 2005/0232017 A1 * | 10/2005 | Fujisawa et al. | 365/185.22 |

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 23 pages.

\* cited by examiner

*Primary Examiner*—VanThu Nguyen
(74) *Attorney, Agent, or Firm*—Harrity Snyder, LLP

(57) ABSTRACT

A method for programming a nonvolatile memory array including an array of memory cells, each memory cell including a substrate, a control gate, a charge storage element, a source region and a drain region, includes performing a program operation on a group of memory cells, where the group of memory cells includes a plurality of subgroups. A verify status value is stored for each subgroup, the verify status value indicating a verify status of each subgroup, wherein the verify status value indicates whether an associated subgroup has been program verified. A program verify operation is performed on a selected subgroup when the verify status value associated with the selected subgroup indicates that the selected verify subgroup has not been program verified.

20 Claims, 5 Drawing Sheets

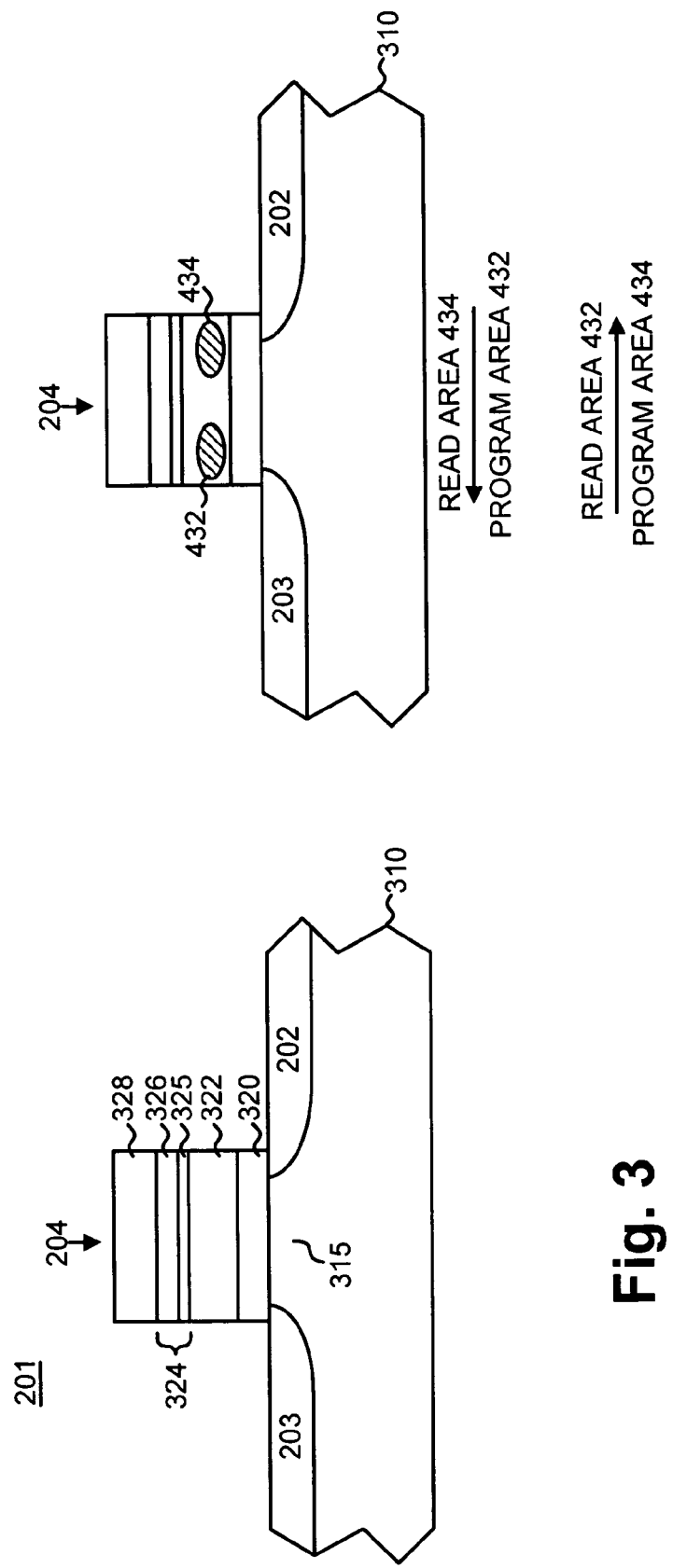

PROGRAM AND PROGRAM VERIFY OPERATIONS FOR FLASH MEMORY

TECHNICAL FIELD

The invention relates generally to non-volatile memory devices, and more specifically, to data programming operations for non-volatile memory devices.

BACKGROUND ART

Flash memory is a common type of non-volatile semiconductor memory device. Non-volatile refers to the trait of retaining stored data when power is turned off. Because flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In a conventional flash memory architecture, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

Flash memory typically includes two distinct types: NOR flash memory, and NAND flash memory. Generally speaking, NOR flash memory is considered to be a code-level memory, while NAND flash memory is considered to be a data-level memory. More specifically, NOR flash memory is typically configured to provide a very reliable storage environment and to further enable fast and random reading of each memory cell in the device. This is accomplished by providing individual contacts to each cell in the device. The reliability and random access nature of the NOR architecture make NOR flash memory particularly suitable for code storage, such as mobile phone and set top box operating systems, etc. Unfortunately, the individually addressable nature of conventional NOR flash memory cells tends to limit the speed at which cells may be programmed and erased, as well as limit rapid reductions in device sizes. Typical NOR flash memory devices have program rates on the order of 0.4 megabytes per second (MB/s) and erase rates on the order of 0.3 MB/s.

NAND flash memory, on the other hand, is configured to enable serial or page-based access to data stored therein. This is accomplished by linking memory cells to each other and only providing access to the cells as a group or page. This architecture has the advantage of enabling decreased device sizes and also for providing fast write times. However, because each cell is not individually addressable, NAND devices are generally considered less reliable and therefore more suitable for data storage than code storage. Typical NAND flash memory devices have program rates on the order of 8 MB/second and erase rates on the order of 60 MB/second.

DISCLOSURE OF THE INVENTION

One aspect of the invention is directed to a method for programming a nonvolatile memory array including an array of memory cells, where each memory cell includes a substrate, a control gate, a charge storage element, a source region and a drain region. The method may include performing a program operation on a group of memory cells, where the group of memory cells includes a plurality of subgroups. A verify status value is stored for each subgroup, the verify status value indicating a verify status of each subgroup, wherein the verify status value indicates whether an associated subgroup has been program verified. A program verify operation is performed on a selected subgroup when the verify status value associated with the selected subgroup indicates that the selected verify subgroup has not been program verified.

Another aspect is directed to a memory device including an array of non-volatile memory cells. The array may include a plurality of columns, each column having a bit line connected to source or drain regions of a plurality of the memory cells, and a plurality of rows, arranged orthogonally to the columns, each row having a word line connected to gate regions of a plurality of the memory cells. A plurality of sense amplifiers may be operatively connected to the plurality of bit lines for sensing a threshold voltage for memory cells connected to the bit lines. Control logic may be configured to receive a page program command, where the page program command indicates program instructions for each partial page in a page of memory cells. Control logic may be configured to store a set of first register values indicating a programmed or nonprogrammed status for each partial page. Control logic may be configured to determine whether a first register value associated with a selected partial page indicates that the selected partial page is programmed or nonprogrammed. Control logic may be configured to perform a program verify operation on the partial page when it is determined that the first register value associated with the selected partial page indicates that the selected partial page is programmed.

Yet another aspect of the invention is directed to a method for programming a page of memory cells configured as an array, where each page includes a plurality of subgroups, and each memory cell includes a substrate, a control gate, a charge storage element having two charge storage areas, a source region, and a drain region. The method may include receiving a program command designating the page; performing a program operation on the page; determining whether a verify status value associated with each subgroup indicates whether an associated subgroup has passed verification; and performing a program verify operation on a selected subgroup when the verify status value associated with the selected subgroup indicates that the selected verify subgroup has not passed verification.

BRIEF DESCRIPTION OF THE DRAWINGS

Reference is made to the attached drawings, wherein elements having the same reference number designation may represent like elements throughout.

FIGS. 3 and 4 are diagrams illustrating a cross-section of an exemplary one of the memory cells shown in FIG. 2;

BEST MODE FOR CARRYING OUT THE INVENTION

Techniques described below relate to a flash memory writing technique in which memory cells may be programmed and verified as a page or as a partial page. Registers may be implemented to facilitate more rapid programming and verification.

Memory Device Overview

Figure 1:
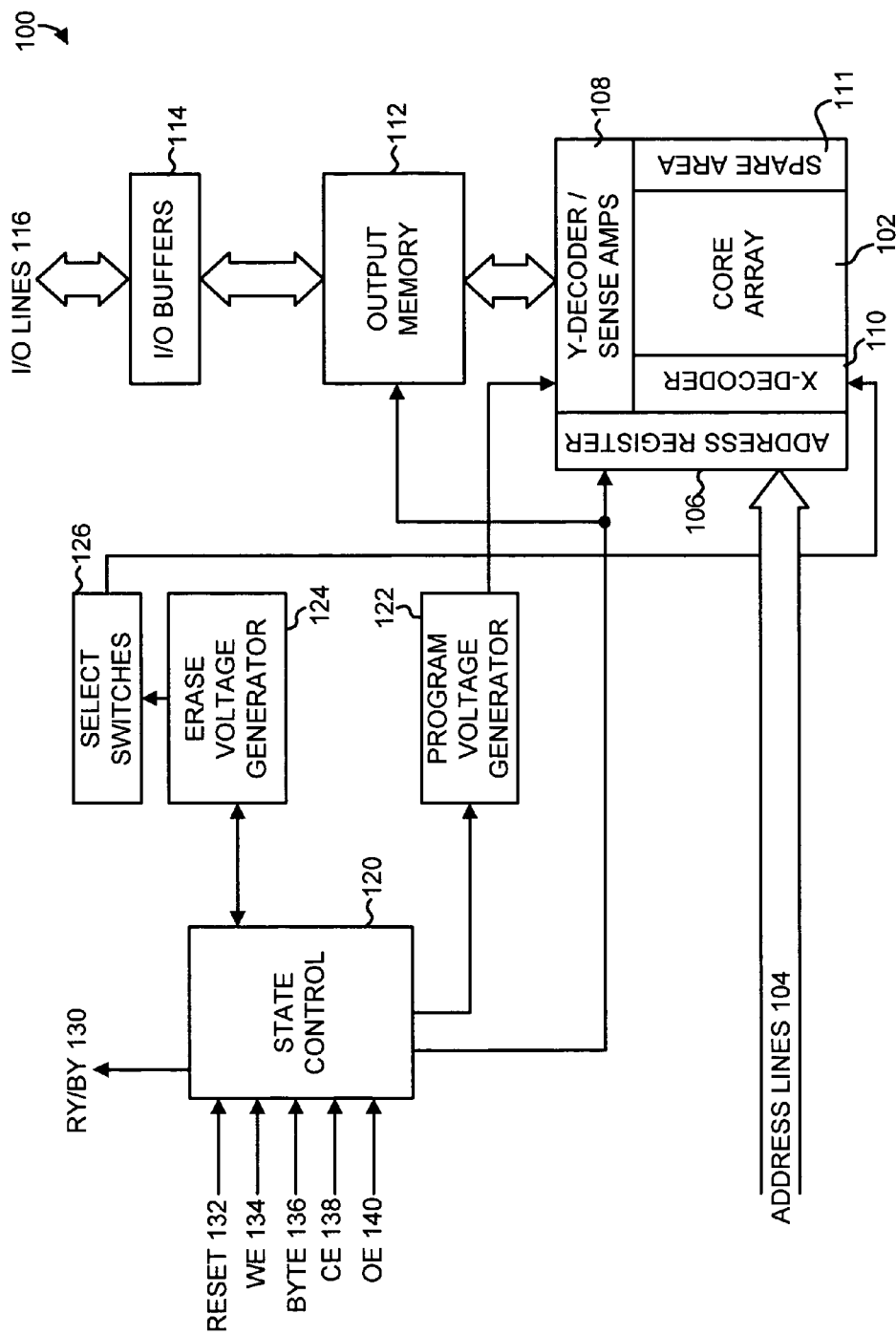
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core array 102. Core array 102 may include arrays of high density memory cells, such as, for example, SONOS-type (silicon-oxide-nitride-oxide-silicon) NOR memory cells, where the nitride layer acts as the charge storage element. More specifically, core array 102 may include multiple M×N memory arrays of substantially identical memory cells. As will be discussed in more detail below, core array 102 may be a sequential access memory in which cells' data may be accessed in designated groups, such as pages or partial pages. Physically, in one implementation consistent with principles of the invention, a page of data may refer to a series of four sequential rows of memory cells in core array 102. Logically, pages can be thought of as blocks of data having predetermined sizes through which memory device 100 is accessed. In one implementation, the page size for memory device 100 is approximately two-thousand bytes (i.e., 2 k bytes).

Core array 102 may be accessed by providing an address for a page via address lines 104 to address register 106. Address register 106 may receive input address values and distribute them to Y-decoder 108 and X-decoder 110. Decoders 108 and 110 may decode the address values so that the source, gate, and drains of the memory cells referred to by the received addresses are activated and their data values read. The decoded addresses specify the appropriate physical lines in the memory cell array(s) that are to be used. For instance, a page of data may be activated and read out of core array 102 in parallel. The read data may be written to output memory 112 before being clocked to input/output (I/O) buffers 114 and read out via I/O lines 116. Y-decoder 108 may also include appropriate sense amplifier circuitry. Sense amplifiers may be used to sense the programmed or non-programmed state of the memory cells in core array 102.

In additional to core array 102, memory cells may also be formed in a peripheral region or "spare area" 111 associated with the core array 102. Data associated with core array 102 but not including substantive user data may be maintained in spare area 111. For example, spare area 111 may include one or more registers associated with the rows and columns (or groups of columns) of core array 102, the purpose of which will be described in additional detail below.

In some implementations, the memory cells in array 102 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell serves as binary unit of data (e.g. either "1" or "0"). Reading or programming one side of a memory cell occurs independently of the data that is stored on the opposite side of the cell.

Output memory 112 may include static random access memory (SRAM) or dynamic random access memory (DRAM) type memory that can serve as a memory cache between core array 102 and I/O buffers 114. Output memory 112 may thus be a volatile memory (i.e., loses its data when powered down) and, relative to the memory cells in core array 102, may be a high speed memory.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126.

State control component 120 may implement a state machine that dictates the function of memory device 100 based on a number of control signals, illustrated as the signals: reset line 132, write enable (WE) line 134, byte line 136, chip enable (CE) line 138, and output enable (OE) line 140. Reset line 132, when activated, causes a hardware reset of memory device 100. Write enable line 134 enables writing of data to core array 102. Byte line 136 selects the width of the output data bus. For example, byte line 136 may cause I/O lines 116 to function as an eight-bit data bus or a sixteen-bit data bus, depending on the state of byte line 136. Chip enable line 138 enables the reading/writing of data to memory device 100. When chip enable line 138 is held at its designated non-active level, the output pins of memory device 100 may be placed in a high impedance (non-active) state. To activate the memory device 100, chip enable line 138 may be held in its active state. Output enable line 140 enables reading of data from core array 102 and outputting the data via I/O lines 116.

Program voltage generator 122 and erase voltage generator 124 may generate the appropriate voltages needed for reading and writing from/to core array 102. For example, in one implementation, core array 102 may require relatively high voltages to erase and program the memory cells in core array 102. These higher voltages may be provided from program voltage generator 122 and erase voltage generator 124.

Select switches 126 may include select transistors connected to core array 102. Each select switch may be used to control a series of memory cells, such as a column of memory cells.

Also shown in FIG. 1 is ready/busy (RY/BY) line 130. Ready/busy line 130 may indicate when memory device 100 is performing an embedded program or erase operation. More specifically, when in the "busy" state, ready/busy line 130 indicates that memory device 100 is currently performing a program or erase operation. When in the "ready" state, ready/busy line 130 indicates that memory device 100 is not currently performing program or erase operations.

Figure 2:
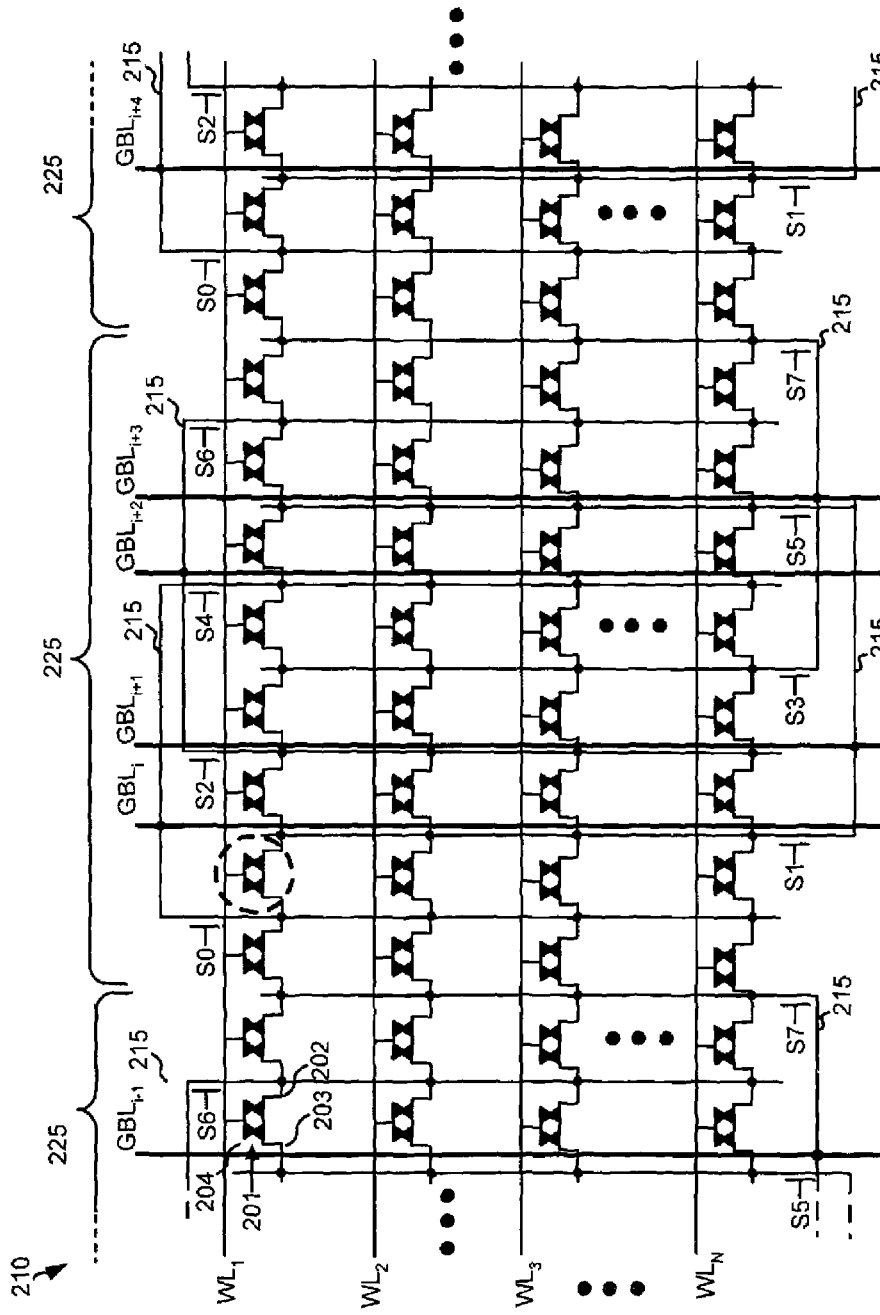
FIG. 2 is a diagram illustrating an exemplary portion of an array of memory cells implemented in the core array shown in FIG. 1.

FIG. 2 is a diagram illustrating an exemplary portion of an array of memory cells implemented in core array 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The configuration illustrated in FIG. 2 includes word lines (word lines $WL_1$ through $WL_N$) each connected to the gate region 204 of a number of memory cells in a row. Bit lines may form columns in the array arranged orthogonally to the rows or word lines in array 210. The bit lines include global bit lines ($GBL_{i-1}$ through $GBL_{i+4}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+4}$, etc. If select transistor S1 was also activated, $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although only six global bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines may correspond to 256 eight memory cell groups 225.

Although the memory cells 201 in core array 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core array 102 includes NOR-type Flash memory. Furthermore, in accordance with principles of the invention, memory cells 201 may be configured to form page-like groups of memory cells to further facilitate NAND-like interaction and performance.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core array 102 of memory device 100 may be programmed by a channel hot electron injection process that injects electrons into charge storage layer 322. The injected electrons become trapped in charge storage layer 322 until an erase operation is performed. Memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S0 and S1. These voltages generate a vertical and lateral electric field in the activated memory cell(s) (e.g., the circled memory cell in FIG. 2) along the length of the channel from the source 203 to the drain 202. These electric fields causes electrons to be drawn off the source 203 and begin accelerating toward the drain 202. As they move along the length of the channel, they gain energy. If they gain enough energy, they can jump over the potential barrier of the dielectric layer 320 into one side of charge storage layer 322 and become trapped. The trapped electrons change the electrical properties of the memory cell 201. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Memory Device Program and Program Verify Operations

In a conventional NOR-type memory cell programming operation, each memory cell to be programmed is subjected to alternating program and verify operations. For example, a programming pulse constituting appropriate source, drain and control gate voltages may be applied to a memory cell 201 for a predetermined period of time. Following application of the programming pulse, a program verify operation may be performed during which the threshold voltage ($V_t$) of memory cell 201 is compared against a reference threshold voltage using sense amplifier circuitry 108.

By comparing the threshold voltage of the memory cell 201 against a reference threshold voltage, a determination can be made as to whether the memory cell 201 has been programmed to the desired program level. In some implementations, this determination may be made my monitoring or sensing the drain to source current through memory cell 201. If it is determined that the threshold voltage is greater than or equal to the reference voltage, the programming is considered completed. However, if it is determined that the threshold voltage is less than the reference voltages, one or more additional program pulses may be applied until the desired program level is achieved.

Figure 5:
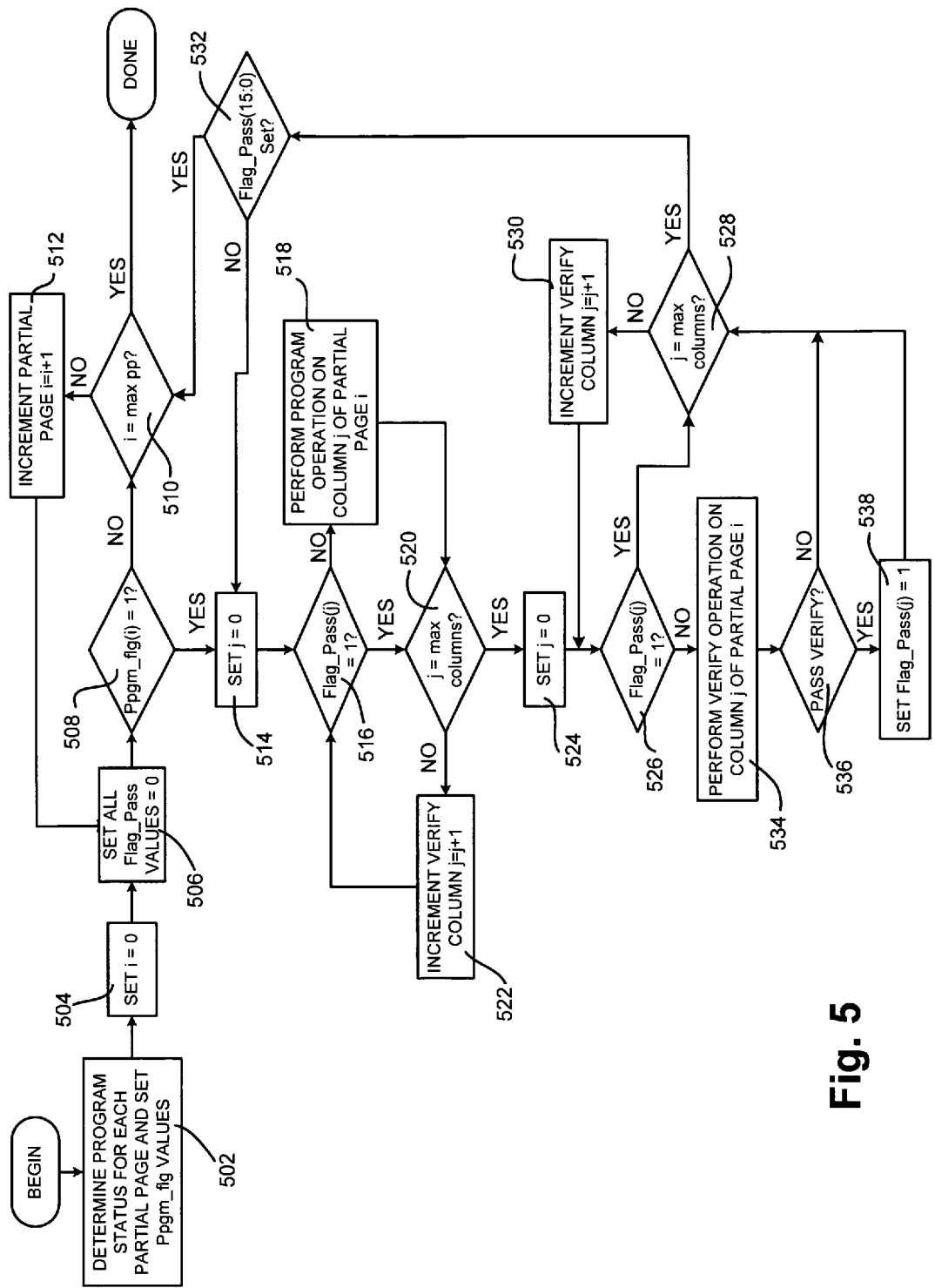
FIG. 5 is a flow diagram illustrating one exemplary method for programming and program verifying the memory cells of FIGS. 2 and 3.

In a manner consistent with principles of the invention, programming and program verification of memory device 100 may be performed at an increased rate. FIG. 5 is a flow diagram illustrating exemplary operations for performing program and program verify operation in memory device 100. As described above, multiple memory cells 201 within core array 102 may be grouped together to form pages or partial pages to facilitate program and read operations on multiple memory cells 201. In one implementation consistent with principles of the invention, spare area 111 may include a number of registers associated with pages, partial pages, or other groups of memory cells within core array 102.

Figure 6A:
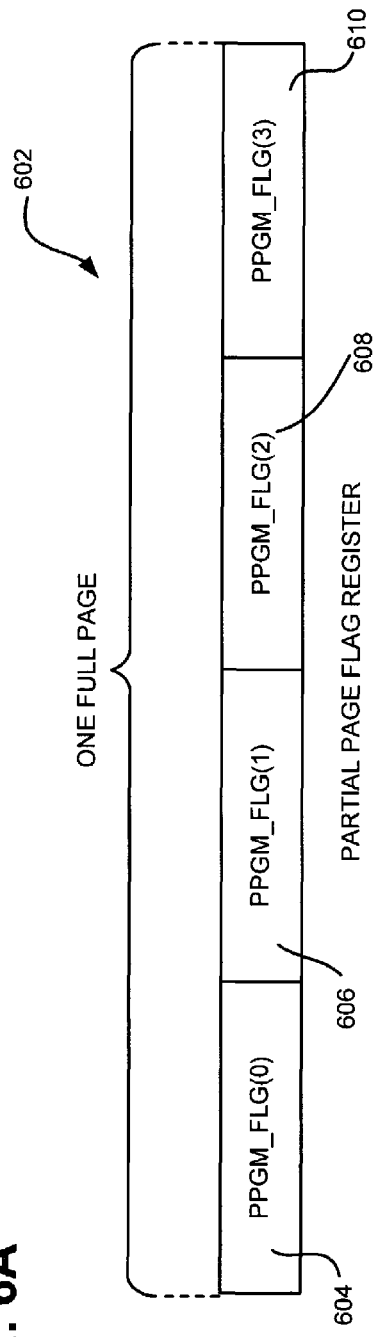
FIGS. 6A and 6B are block diagrams conceptually illustrating partial page flag and flag pass registers, respectively, in accordance with one implementation consistent with principles of the invention.

More specifically, spare area 111 may include a partial page flag register and a flag pass register. FIG. 6A is a block diagram conceptually illustrating a partial page flag register 602. Partial page flag register 602 may be configured to store data indicative of a programmed or nonprogrammed state for a page or a partial page. A page or partial page is considered to be in a programmed state when at least one bit contained within the page or partial page is programmed. Conversely, where all bits within page or partial page are nonprogrammed, the page or partial page is considered nonprogrammed. For example, if a page within core array 102 includes four partial pages 604, 606, 608, 610, data indicative of the programmed (e.g., a logical "1") or non-programmed state (e.g., a logical "0") for each partial page (604-610) may be stored in the partial page flag register 602.

Partial page flags are determined and set during the user command/data input cycles. Each value within partial page flag register 602 is set to a '1' or a '0' according to a user input pattern. The value indicates that the user wishes to program a pattern into a partial page if a corresponding partial page flag value is set to '1'. Otherwise, a '0' value for the partial page flag indicates that the page is not to be programmed. In the manner described below, only partial pages having partial page flag values set to '1' are processed for program and program verify operations. The internal logic control will skip program or program verify for the partial pages that have value '0' in their partial page flags.

Figure 6B:
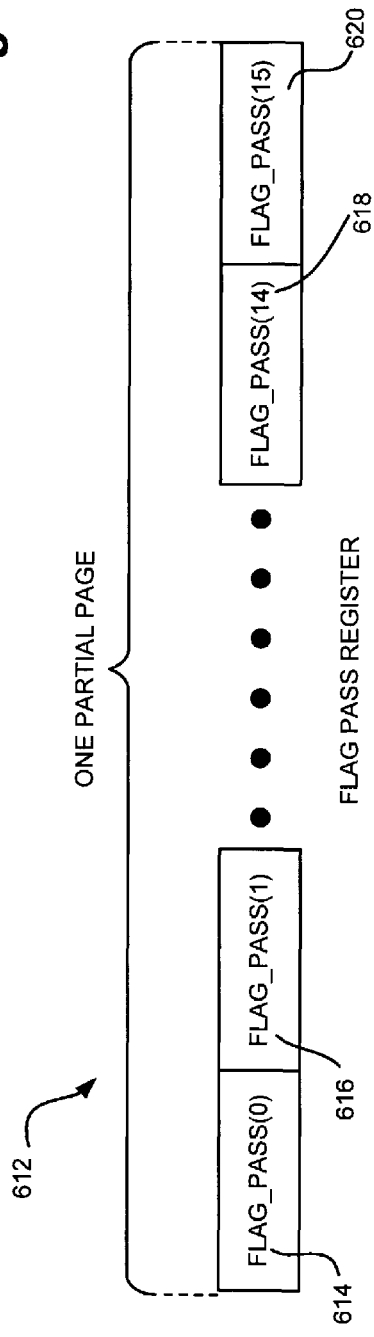

FIG. 6B is a block diagram conceptually illustrating one implementation of a flag pass register 612 consistent with principles of the invention. Flag pass register 612 may be configured to store data indicative of the verified or non-verified status of one or more memory cells 201 within a partial page or page. In one implementation consistent with principles of the invention, groups of memory cells with a partial page may be simultaneously verified. For example, in one embodiment, a 2 kilobyte page (2048 bytes) may include four 512 byte partial pages, with each partial page having sixteen 32 byte (or 256 bit) verify columns (614-620), with each bit within a verify column (614-620) being simultaneously or parallel verified. Flag pass register 612 may be configured to store data regarding the verification status for each verify column (614-620) in the partial page currently being programmed (e.g., partial pages 604-610). In one implementation, verify columns passing verification may be indicated in flag pass register 612 with a logical "1", while those failing verification may be indicated in flag pass register 612 with a logical "0".

Returning to FIG. 5, program/verify operation may initially begin with state control element 120 receiving a page program command identifying whether each partial page within the current page is to be programmed or not and setting the corresponding partial page program flag (Ppgm_Flag) register values (act 502). For partial pages to be programmed in the current operation, partial page program flag register values may be set to a logical "1", while register values associated with those partial pages remaining non-programmed will remain as a logical "0". Recall that if even a single bit within the partial page is to be programmed, the entire partial page is considered programmed from the standpoint of the partial page program flag register.

Next, a counter i used to proceed through a number of partial pages is initialized to 0, or the first partial page (act 504). All Flag Pass (Flag_Pass) register values in the current partial page are then set to 0, indicating that no columns in the current partial page have yet passed verify (act 506). Next, it is determined whether the partial page flag value associated with a current partial page i indicates whether the partial page is programmed (e.g., a logical "1") or nonprogrammed (e.g., a logical "0") (act 508). If the partial page is nonprogrammed, it is determined whether all partial pages with the current page have been programmed and verified (e.g., i=max partial page) (act 510). If all partial pages have been either nonprogrammed or programmed and verified (as discussed below), the program and program verify process for the current page is complete. However, if it is determined that not all partial pages have been either nonprogrammed or programmed and verified, the partial page i is incremented by 1 (e.g., i=i+1) (act 512) and the process returns to act 506 for the next partial page.

If it is determined in act 508 that partial page flag value associated with a current partial page i indicates that the partial page is programmed, a second counter j, associated with the verify columns in the current partial page, is initialized to 0 (act 514). Next, it is determined whether the Flag_Pass value for the jth verify column indicates whether the column has passed verify (act 516). If it is determined that the jth column has not passed verify, a program operation may be performed on column j of partial page i (act 518). It is then determined whether each column has been processed (e.g., does j=max number of columns?) (act 520). If not, j is incremented by 1 (e.g., j=j+1) (act 522) and the process returns to act 516 for the next column. The process repeats until all necessary programming operations have been performed for partial page i. If it is determined in act 516 that the jth column has passed verify, the process flows directly to act 520, bypassing the programming operation for the jth column.

If it is determined in act 520 that all columns have been processed, the j counter is reset to 0 for additional column processing (act 524). Next, it is again determined whether the Flag_Pass value for the jth verify column indicates whether the column has passed verify (act 526). If it is determined that the jth column has passed verify (as evidenced by a Flag_Pass value of 1), it is then determined whether all columns have been processed (act 528). If all columns have not been processed, j is incremented by 1 (e.g., j=j+1) (act 530) and the process returns to act 526 for the next column. However, if all columns have been processed, the process flows to act 532, where it is determined whether all Flag_Pass values for partial page i have been set to 1. If each Flag_Pass value has not been set to 1, the process returns to act 514. However, if all Flag_Pass values for partial page have been set, the process continues to act 510 where it is determined whether all partial pages have been processed.

Returning to act 526, if it is determined that the jth column has not passed verify, a verify operation may be performed on column j of partial page i (act 534). It is then determined whether column j passes verify (act 536). If column j passes verify, the Flag_Pass value associated with column j is set to 1, indicating that verify has been passed during subsequent iterations (act 538). The process then continues to act 528, described above, where it is determined whether all columns have been processed. If it is determined in act 536 that column j does not pass verify, the process continues directly to act 528 and skips the setting of the Flag_Pass value. This results in further program operations being performed on column j during subsequent iterations. Because only columns having 0 Flag_Pass values are subjected to additional programming and verification, significant time savings may be realized.

CONCLUSION

As described above, a program and program verify operation for a memory device may be performed in an efficient manner for each partial page (or page) and each verify grouping within the page. One or more register values may advantageously enable the program verify operation to avoid unnecessary verifications.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 5, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method for programming a nonvolatile memory array including an array of memory cells, each memory cell including a substrate, a control gate, a charge storage element, a source region and a drain region, comprising:
    performing a program operation on a group of memory cells, where the group of memory cells includes a plurality of subgroups, each of the plurality of subgroups comprising more than one memory cell;
    storing a verify status value for each subgroup indicating whether an associated subgroup has been program verified; and
    performing a program verify operation on a selected subgroup when the verify status value associated with the selected subgroup indicates that the selected subgroup has not been program verified.

2. The method of claim 1, wherein the verify status values are stored in one or more registers associated with the memory array.

3. The method of claim 1, wherein the performing a program verify operation comprises:
    determining whether a threshold voltage associated with the selected subgroup is equal to or exceeds a reference voltage, the method comprising:
    modifying the verify status value associated with the selected subgroup to indicate that the selected subgroup has been program verified when it is determined that the threshold voltage associated with the selected subgroup is equal to or exceeds the reference voltage; and
    performing an additional program operation on the selected subgroup of memory cells when it is determined that the threshold voltage associated with the selected subgroup does equal or exceed the reference voltage.

4. The method of claim 3, further comprising:
    setting the selected subgroup to a first subgroup when it is determined that the threshold voltage associated with the selected subgroup does not equal or exceed the reference voltage.

5. The method of claim 3, further comprising:
    determining whether each subgroup in the group of memory cells has been program verified; and
    incrementing a selected subgroup to a next subgroup when it is determined that each subgroup in the group of memory cells has not been program verified.

6. The method of claim 1, wherein the group of memory cells comprises a page.

7. The method of claim 1, wherein the plurality of subgroups comprise a group of partial pages, the group of partial pages including a selected partial page.

8. The method of claim 7, further comprising:
storing a partial page program value for each partial page in the group of partial pages indicating whether an associated partial page is programmed or nonprogrammed; and
performing the program verify operation on the selected partial page when it is determined that the partial page program value for the selected partial page indicates that the selected partial page is programmed.

9. The method of claim 8, wherein the partial page program values are stored in one or more registers associated with the memory array.

10. The method of claim 8, further comprising:
determining whether each partial page in the group of partial pages has been processed; and
incrementing the selected partial page in the group of partial pages to a next partial page when it is determined that each partial page in the group of partial pages has not been processed.

11. The method of claim 7, wherein each partial page in the group of partial pages comprises a row of memory cells in the array of memory cells.

12. The method of claim 11, wherein the group of partial pages includes four rows of memory cells in the array of memory cells.

13. The method of claim 1, wherein the memory cells include SONOS (silicon-oxide-nitride-silicon) type NOR memory cells.

14. The method of claim 1, wherein the memory cells include a charge storage element configured to include at least two charge storage areas for storing at least two independent charges.

15. A memory device comprising:
an array of non-volatile memory cells, the array comprising:
a plurality of columns, each column having a bit line connected to source or drain regions of a plurality of the memory cells, and
a plurality of rows, arranged orthogonally to the columns, each row having a word line connected to gate regions of a plurality of the memory cells;
a plurality of sense amplifiers operatively connected to the plurality of bit lines for sensing a threshold voltage for memory cells connected to the bit lines;
control logic configured to receive a page program command, wherein the page program command indicates program instructions for each partial page in a page of memory cells;
control logic configured to store a set of first register values indicating a programmed or nonprogrammed status for each partial page;
control logic configured to determine whether a first register value associated with a selected partial page indicates that the selected partial page is programmed or nonprogrammed; and
control logic configured to perform a program verify operation on the partial page when it is determined that the first register value associated with the selected partial page indicates that the selected partial page is programmed.

16. The memory device of claim 15, comprising:
control logic configured to determine whether each partial page in the page of memory cells has been either programmed and verified or identified as nonprogrammed; and
control logic configured to increment a selected partial page to a next partial page when it is determined that each partial page in the page of memory cells has not been either programmed and verified or identified as nonprogrammed.

17. The memory device of claim 15, wherein each partial page of memory cells includes a plurality of subgroups, the device comprising:
control logic configured to storing a verify status value for each subgroup indicating a verify status of each subgroup, wherein the verify status value indicates whether an associated subgroup has passed a verify operation; and
control logic configured to perform a program verify operation on a selected subgroup when the verify status value associated with the selected subgroup indicates that the selected subgroup has not passed the verify operation.

18. The memory device of claim 17, further comprising:
control logic configured to determine whether all subgroups in the partial page have passed the verify operation; and
control logic configured to increment the selected subgroup to a next subgroup when it is determined that all subgroups in the partial page have not passed the verify operation.

19. A method for programming a page of memory cells configured as an array, each page including a plurality of subgroups, with each subgroup comprising more than one memory cell, and each memory cell including a substrate, a control gate, a charge storage element having two charge storage areas, a source region, and a drain region, comprising:
receiving a program command designating the page;
performing a program operation on the page;
determining whether a verify status value associated with each subgroup indicates whether an associated subgroup has passed verification; and
performing a program verify operation on a selected subgroup when the verify status value associated with the selected subgroup indicates that the selected subgroup has not passed verification.

20. The method of claim 19, wherein the performing a program verify operation comprises:
determining whether a threshold voltage associated with the selected verify subgroup meets or exceeds a reference voltage, the method further comprising:
setting the verify status value associated with the selected subgroup to indicate that the selected subgroup has passed verification when it is determined that the threshold voltage associated with the selected subgroup meets or exceeds the reference voltage.

* * * * *